(12) United States Patent
Takahashi

(10) Patent No.: US 7,370,785 B2
(45) Date of Patent: May 13, 2008

(54) WIRE BONDING METHOD AND APPARATUS

(75) Inventor: Koichi Takahashi, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/945,631

(22) Filed: Sep. 21, 2004

(65) Prior Publication Data
US 2005/0061849 A1    Mar. 24, 2005

(30) Foreign Application Priority Data
Sep. 22, 2003   (JP) .............................. 2003-329987

(51) Int. Cl.
*B23K 31/02*   (2006.01)
(52) U.S. Cl. ...................... 228/102; 228/4.5; 228/103; 228/180.5
(58) Field of Classification Search .................... None
See application file for complete search history.

(56) References Cited

U.S. PATENT DOCUMENTS

| | | | | |
|---|---|---|---|---|
| 4,213,556 A | * | 7/1980 | Persson et al. | ............. 228/104 |
| 4,763,827 A | * | 8/1988 | Watanabe et al. | ........... 228/102 |
| 4,817,848 A | * | 4/1989 | Gabaldon | ................... 228/102 |
| 5,219,112 A | * | 6/1993 | Mochida et al. | ............. 228/4.5 |
| 6,206,266 B1 | * | 3/2001 | Takahashi et al. | .......... 228/102 |
| 6,923,361 B2 | * | 8/2005 | Maeda | ........................ 228/1.1 |
| 2003/0218048 A1 | * | 11/2003 | Maeda | ........................ 228/1.1 |

FOREIGN PATENT DOCUMENTS

| | | | |
|---|---|---|---|
| JP | 58-184734 | | 10/1983 |
| JP | 58-184734 A | * | 10/1983 |
| JP | 6-29343 | | 2/1994 |
| JP | 61-163648 | | 10/1994 |
| JP | 10-112471 | | 4/1998 |
| JP | 2000-306940 A | * | 2/2000 |
| JP | 2000-294592 | | 10/2000 |
| JP | 2000-306940 | | 11/2000 |
| JP | 2001-298040 A | * | 10/2001 |
| JP | 2002-280410 | | 9/2002 |

* cited by examiner

*Primary Examiner*—Kiley Stoner
(74) *Attorney, Agent, or Firm*—William L. Androlia; H. Henry Koda

(57) ABSTRACT

A wire bonding apparatus and method involving a computer 41 that has a height position counter 44 that produces height position signals for a capillary 5 by processing signals from a position sensor 29 that detects the position of the bonding arm 20 in the vertical direction. This computer 41 includes a memory 60, which stores the detected position of the capillary 5 at the time that secondary bonding is performed on a bump that is formed in a normal manner on the second conductor, and a comparator circuit 61, which outputs a "bump not-adhered" signal in cases where the output value of the height position counter 44 is outside the permissible error range of the detected position that is stored in the memory 60.

6 Claims, 5 Drawing Sheets

WIRE BONDING METHOD AND APPARATUS

BACKGROUND OF THE INVENTION

1. Technical Field

The present invention relates to a wire bonding method and apparatus for connecting a wire to a first conductor and a bump on a second conductor after such a bump has been formed on the second conductor.

2. Description of the Related Art

In wire bonding, since a ball formed on the tip end of the wire is bonded to the first conductor as a primary bonding, the joining properties are good. However, to the second conductor, since the wire without a ball is bonded as a secondary bonding, the joining properties are poor compared to the joining properties of the primary bonding. Accordingly, a unique technique is used, in which a bump is formed on the second conductor, and then the wire is connected between the first conductor and the bump on the second conductor.

Japanese Patent Application Laid-Open (Kokai) Nos. H10-112471 and 2002-280410, for instance, respectively disclose such a wire bonding method as described above, and it is described in FIG. 3.

As shown in FIG. 3(a), a die 2 on which a bump(s) 2a is formed is mounted on a circuit board 1, which is a lead frame or a board such as a ceramic board or printed board, etc. Wiring 3 is also formed on the circuit board 1. A bump(s) 10 is formed on the wiring 3 beforehand by a wire bonding apparatus. The upper surface of the bump 10 has an inclined surface 12 that is formed so as to be inclined in the opposite direction from the die 2 (first conductor). Accordingly, after a ball is formed on the tip end of the wire 4 by means of an electric torch (not shown), the capillary 5 is lowered and primary bonding is performed on the pad 2a of the die 2 as shown in FIG. 3(a); next, as shown in FIG. 3(b), looping of the wire 4 is performed, the wire 4 is positioned on the upper part of the inclined surface 12 of the bump 10, and secondary bonding of the wire 4 to the inclined surface 12 is performed. Subsequently, the wire 4 is cut.

In the example of FIG. 4, a bump 10 is formed beforehand on the pad 2a, and the inclined surface 12 of the bump 10 is formed on the opposite side from the wiring 3. Accordingly, primary bonding is performed on the wiring 3, secondary bonding is performed on the inclined surface 12 of the bump 10, and the wire 4 is then cut.

The wire bonding apparatus that performs the shaping of the bumps 10 and the connection of the wire 4 has a structure shown in FIG. 5.

A bonding arm 20 which has a capillary 5 on its one end is fastened to one end of a supporting frame 21. The supporting frame 21 is attached to a moving table 23 via a supporting shaft (not shown in the drawings) or a plate spring 22 assembled in a cruciform configuration so that this supporting frame 21 is free to swing upward and downward, and the moving table 23 is mounted on an XY table 24. The coil 26 of a linear motor 25 is fastened to the other end of the supporting frame 21, and the magnet 27 of this linear motor 25 is fastened to the moving table 23. A linear scale 28 is fastened to the rear end of the supporting frame 21, and a position sensor 29 is fastened to the moving table 23 so as to face this linear scale 28. The wire bonding apparatus further has a heater block 31 that heats the device 30. The heater block 31 is raised and lowered by a raising-and-lowering mechanism 32.

Japanese Patent Application Laid-Open (Kokai) Nos. S58-184734, H6-29343 and S61-163648 (Publication (Kokoku) No. H6-80697), for instance, disclose the wire bonding apparatus of the above-described type.

In structure described above, the supporting frame 21 and bonding arm 20 are caused to swing about the supporting shaft or plate spring 22 by the linear motor 25, so that the capillary 5 is raised and lowered. The moving table 23, supporting frame 21, bonding arm 20 and capillary 5 are moved in the X and Y directions by the XY table 24. The bumps 10 shown in FIGS. 3(a) and 3(b) and 4 are formed on the device 30 by the formation of a ball on the tip end of the wire 4 by an electric torch (not shown in the drawings), the raising and lowering movement of the capillary 5, and the opening-and-closing movement of wire cutting clampers (not shown in the drawings) during the cutting of the wire, etc. The wire 4 is connected to the device 30 as shown in FIGS. 3(a) and 3(b) and 4 by the formation of a ball on the tip end of the wire 4 by the electric torch (not shown in the drawings), a combination of upward and downward movement and movement in the X and Y direction of the capillary 5, and the opening-and-closing movement of the wire cutting clampers (not shown in the drawings) during the cutting of the wire, etc.

Next, a control of the linear motor 25 and actions of the respective blocks will be described.

The input-output of various types of information required for operation to and from the computer 41 is performed by external input-output means 40. This can be accomplished by manual operation or by operation based on-line communications with an external device. The computer 41 has a control circuit 42, a calculating circuit 43 and a height position counter 44; and the control circuit 42 controls the external input-output means 40, the calculating circuit 43 and a position control circuit 50.

When a height position command for the capillary 5 is inputted into the position control circuit 50 from the control circuit 42, the position control circuit 50 transmits the amount of movement of the capillary 5 to a motor driver 51 as a driving signal 50a. In accordance with this driving signal 50a, the motor driver 51 generates electric power that is used to move the capillary 5 to the designated position. Since such electric power is a product of voltage and current, the actual control of the linear motor 25 can be accomplished by controlling either the voltage or current, or both. Here, the system will be described in terms of the driving current 51a that flows to the linear motor 25. When the driving current 51a produced by the motor driver 51 is applied to the coil 26 of the linear motor 25, a driving force is generated. The supporting frame 21, bonding arm 20 and capillary 5 are caused to swing about the plate spring 22 by this driving force.

The height position counter 44 counts signals from an encoder 52 that converts the signal from the position sensor 29 into a signal format that is suitable for inputting into the computer 41, and also the height position counter 44 generates the actual height position of the linear scale 28. The computer 41 is inputted beforehand with the ratio of the amount of movement of the capillary 5 in the vertical direction to the amount of movement of the linear scale 28 in the vertical direction and with a quantization coefficient (one unit equals several microns). Accordingly, the computer 41 determines the actual height position of the capillary 5 by performing a mathematical operation (by means of the calculating circuit 43) on the value indicated by the height position counter 44 on the basis of the above-described ratio and quantization coefficient.

In cases where no bump 10 is formed on the second conductor, the joining strength between the wire 4 and second conductor 2 in the secondary bonding is poor. Accordingly, it is necessary to examine whether or not a bump 10 is normally formed on the second conductor.

Japanese Patent Application Laid-Open (Kokai) No. 2000-306940, for example, discloses inspection for bump if it is formed or not formed (or adhered) at the time of bump formation.

In Japanese Patent Application Laid-Open (Kokai) No. 2000-306940, with a utilization of the time constant of the total impedance of the device, wire and internal parts of the circuit during monitoring of the state of electrical continuity with a voltage applied, a voltage is applied to the wire during the period which is from the connection of the ball to the conductor to the cutting of the wire from the attachment root of the ball, and the presence or absence of ball non-adhesion is ascertained by detecting variations in the voltage during the above-described period according to the presence or absence of ball non-adhesion, and specifically by detecting the delay time in the rise of the voltage.

Since bump not-adhered can be detected by the method of Japanese Patent Application Laid-Open (Kokai) No. 2000-306940 at the time of bump formation, devices on which a bump is not adhered should not be sent into subsequent processes. However, in this prior art, no great difference is generated in the voltage rise time between the state in which the wire is normally cut (tail cutting) following the raising of the capillary and the state in which no bump is adhered. Accordingly, there is a danger that a "bump not-adhered" situation cannot be judged in a normal fashion. Currently, therefore, devices on which bumps are formed are subjected to an external appearance inspection, which is conducted for all of the devices produced, by an image processing device.

BRIEF SUMMARY OF THE INVENTION

The object of the present invention is to provide a wire bonding method and apparatus that requires no external appearance inspection for all of the devices produced and that detects a "bump not-adhered" situation during wire bonding, thus improving the productivity.

The above objects are accomplished by a unique structure of the present invention for a wire bonding apparatus that comprises a bonding arm which has a capillary on its one end part and is supported on a supporting frame so that this boning arm can swing, a linear motor which drives this bonding arm in a swing motion, a position sensor that detects the position of the bonding arm in the vertical direction, and a computer which has a height position counter that produces a height position signal for the capillary by processing the signal from the position sensor; and in this bonding apparatus, primary bonding is performed on a first conductor of a device in which a bump is formed on a second conductor, and secondary bonding is then performed on the bump on the second conductor, so that a wire is connected between the first conductor and second conductor; and in the present invention, the above-described computer includes a memory and a comparator circuit wherein the memory stores the detected position of the capillary when the secondary bonding is performed on a bump that has been formed in a normal manner on the second conductor, and the comparator circuit outputs a "bump not-adhered" signal in cases where the output value of the height position counter is outside the permissible error range of the detected position stored in the memory.

The above object is further accomplished by a unique step of the present invention for a wire bonding method in which primary bonding is performed on a first conductor of a device in which a bump is formed on a second conductor, and secondary bonding is then performed on the bump on the second conductor, so that a wire is connected between the first conductor and second conductor; and in the present invention, in cases where the capillary is lowered, during the secondary bonding, beyond the permissible error range of capillary position in which a bump has been formed in a normal manner on the second conductor, an apparatus that executes the above bonding method is stopped by way of taking such a capillary position that is lowered beyond the permissible error range as a situation in which a bump is not adhered.

Since a "bump not-adhered" situation is detected upon connection of a wire to a first conductor and a bump on a second conductor, there is no need to inspect the external appearance of all of the devices after bump formation, and there is likewise no need for an inspection apparatus, so that the productivity is high.

DETAILED DESCRIPTION OF THE INVENTION

One embodiment of the present invention will be described with reference to FIGS. 1 and 2. Members that are the same as in FIGS. 3(a) through 5 or that correspond to those in FIGS. 3(a) through 5 are labeled with the same symbols, and a detailed description of such members is omitted.

Figure 1A:
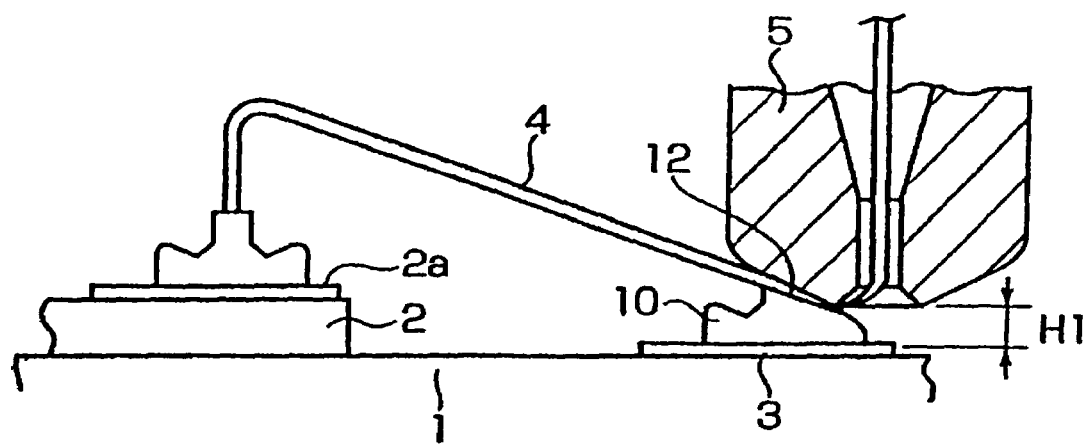
FIGS. 1(a) and 1(b) show one embodiment of the wire bonding method of the present invention.
Figure 3A:
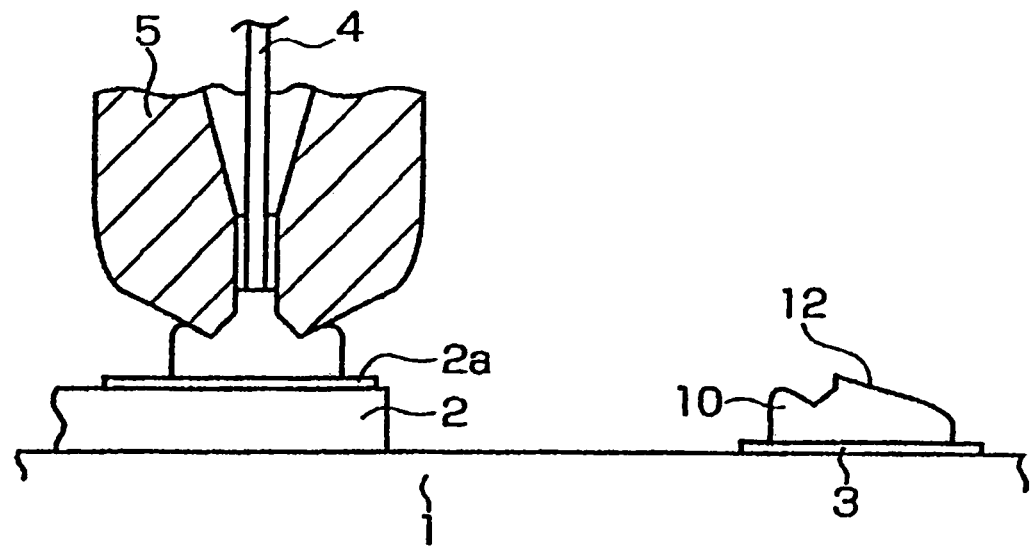
FIGS. 3(a) and 3(b) show one example of a conventional wire bonding method.
Figure 3B:
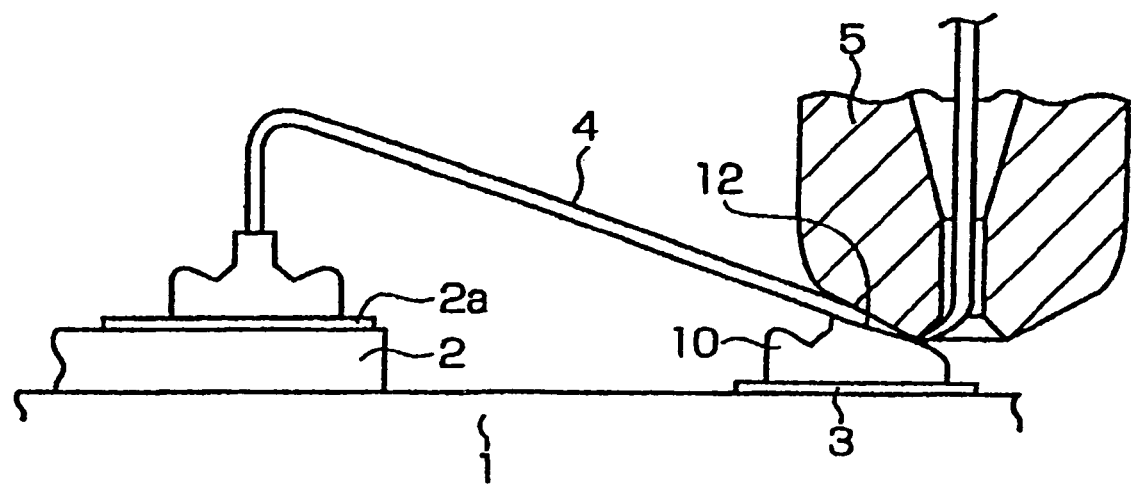
Figure 4:
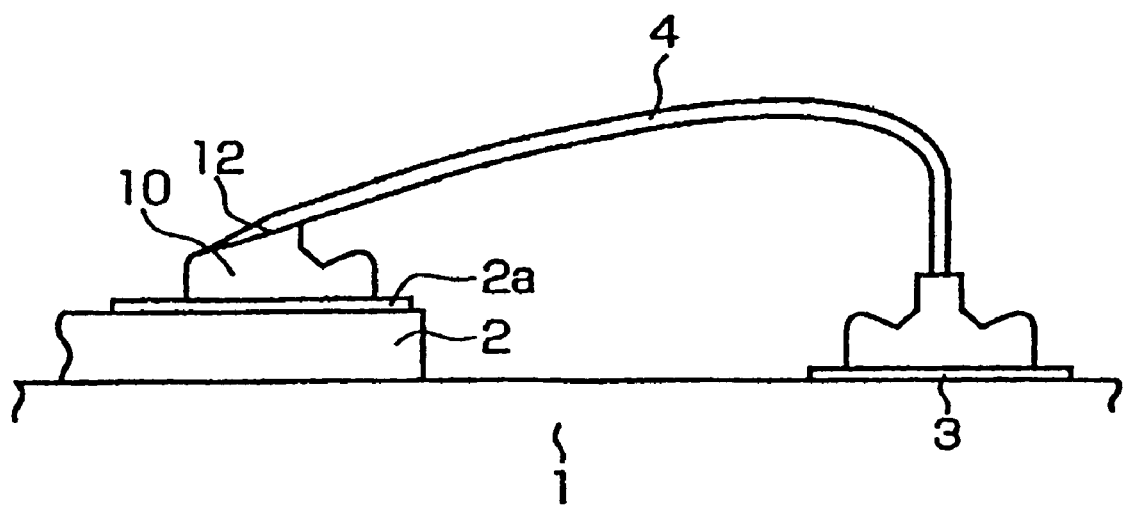
FIG. 4 shows another example of a conventional wire bonding method.
Figure 5:
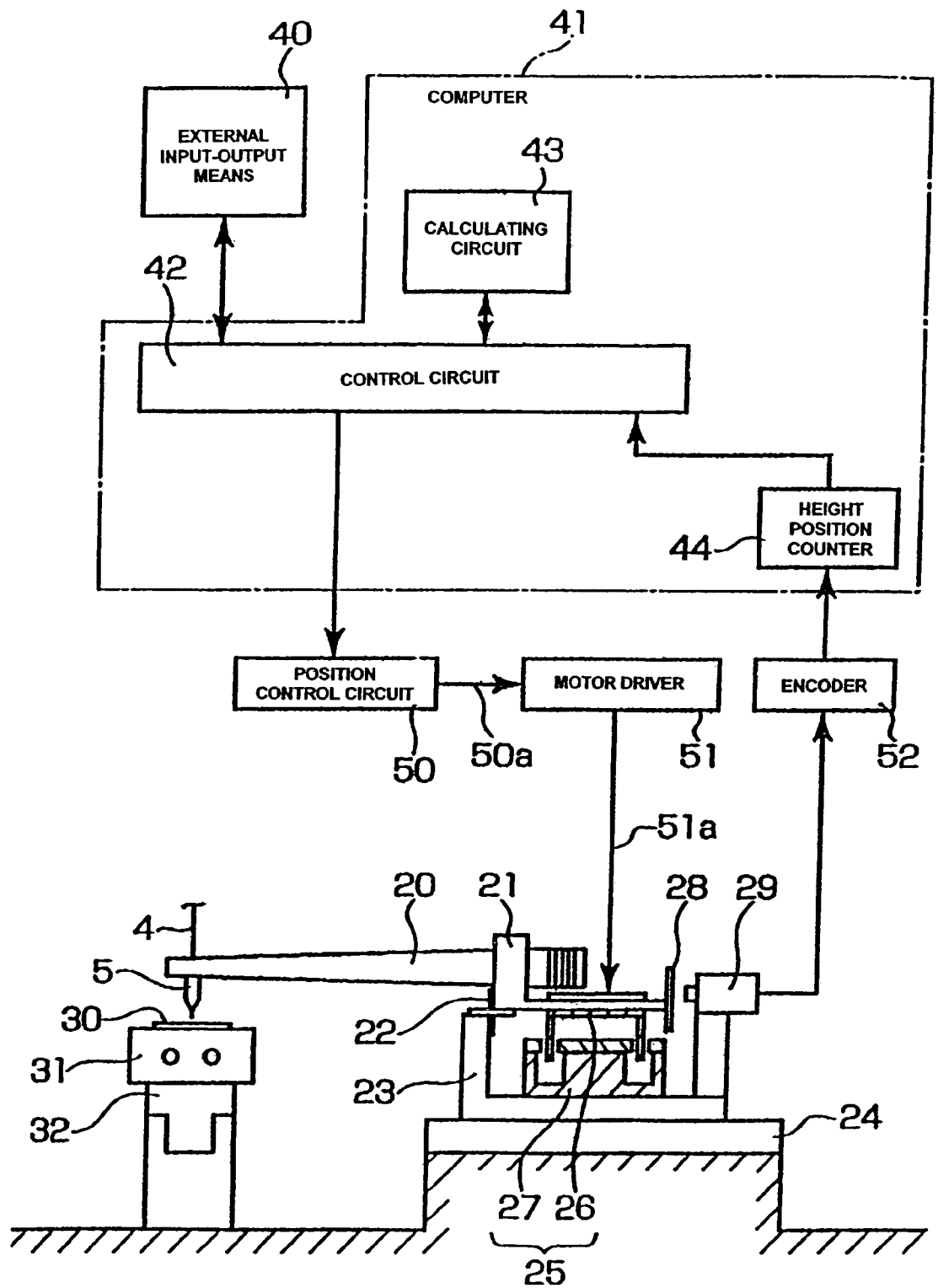
FIG. 5 shows a conventional wire bonding apparatus.

FIG. 1(a) shows the same state as in FIG. 3(b). First, the operation described below is performed prior to the wire bonding operation.

Figure 1B:
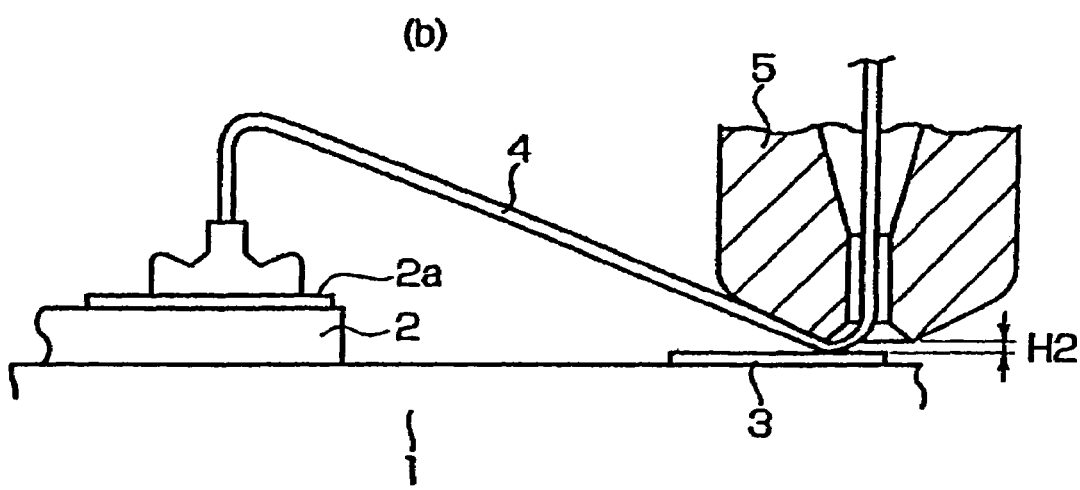
Figure 2:
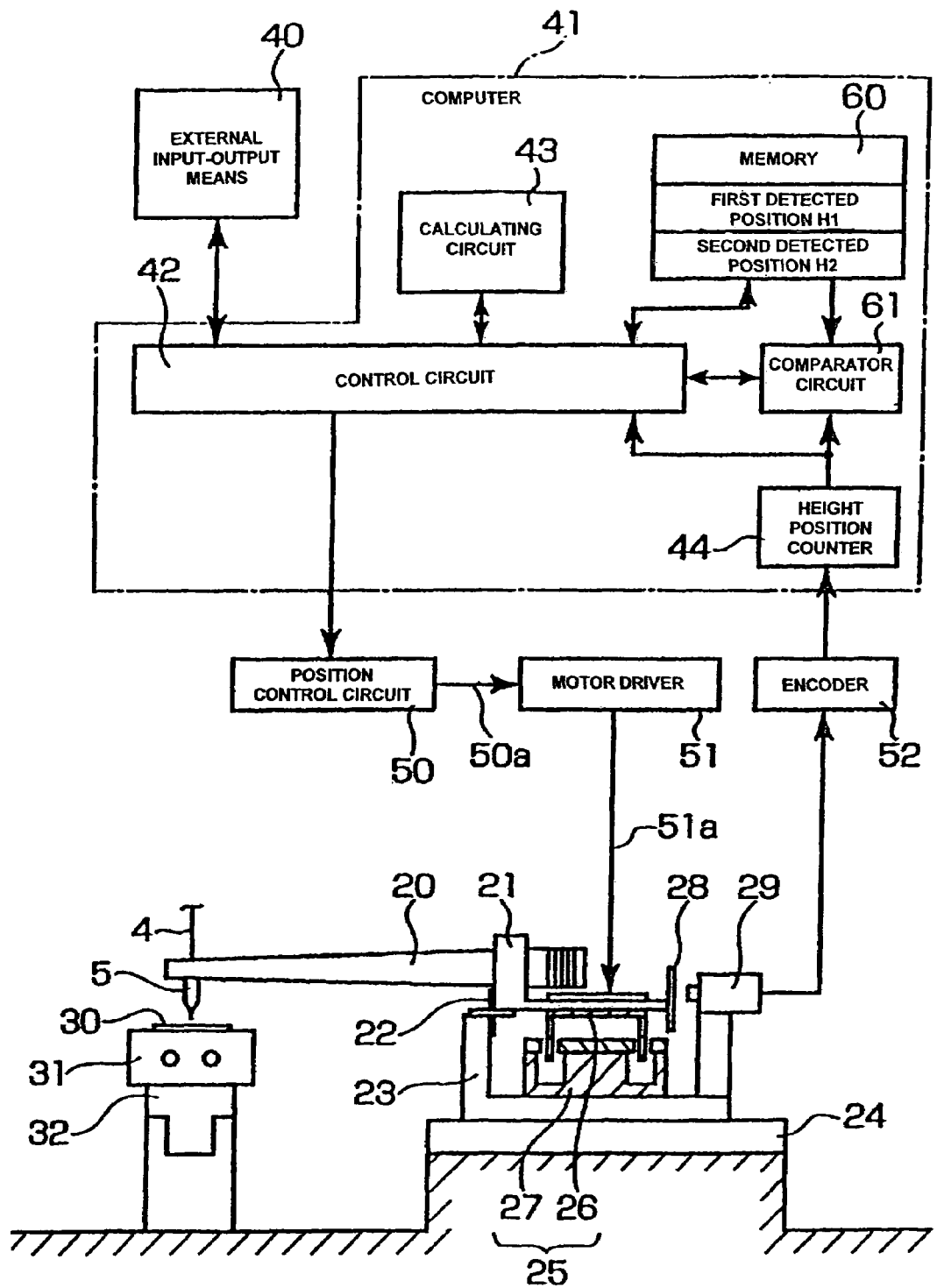
FIG. 2 shows one embodiment of the wire bonding apparatus of the present invention.

The first detected position H1 which is shown in FIG. 1(a) and is the level (height) of the lower end of the capillary 5 at the time that secondary bonding of the wire 4 to the bump 10 is performed is stored in the memory 60 of the computer 41 shown in FIG. 2. In other words, the position of the capillary 5 in the state shown in FIG. 1(a) is detected by a position sensor 29, the signal resulting from this detection by the position sensor 29 is converted by a height position counter 44 via an encoder 52, and the value produced by this conversion is stored in the memory 60 of the computer 41. FIG. 1(b) shows a case in which a bump 10 is not formed; and a second detected position H2 which is the level (height) of the lower end of the capillary 5 when the capillary 5 is lowered so that the wire 4 contacts the wiring 3 is stored in the memory 60 of the computer 41 in the same manner as the first detected position H1.

The computer 41 has a comparator circuit 61 that compares the values of the height position counter 44 and the values stored in the memory 60. In cases where the value of the height position counter 44 is outside the permissible error range of the first detected position H1 stored in the memory 60 when the wire 4 is secondarily bonded to the bump 10 formed on the wiring 3 that constitutes the second conductor, the comparator circuit 61 outputs a "bump not-adhered" signal.

Next, the operation will be described.

As shown in FIG. 1(a), after a bump 10 has been formed on the wiring 3, or after bumps 10 have been formed on the wiring 3 of all of the devices, the wire 4 is connected as shown in FIG. 1(a) using the wire bonding apparatus shown in FIG. 2. More specifically, after a ball has been formed on the tip end of the wire 4 by means of an electric torch, the capillary 5 is lowered, and primary bonding is performed on the pad 2a of the die 2. Next, looping of the wire 4 is performed, the wire 4 is positioned on the upper part of the inclined surface 12 of the bump 10, and secondary bonding of the wire 4 to the inclined surface 12 is performed. Subsequently, the wire 4 is cut.

Thus, when the wire 4 is secondarily bonded to the bump 10 on the wiring 3, if the bump 10 is formed on the wiring 3 in a normal manner as shown in FIG. 1(a), the output value of the height position counter 44 will agree with the first detected position H1 stored in the memory 60 and thus is within the permissible error range of this position H1. Accordingly, there is no output from the comparator circuit 61, and it is judged that the bump is normal.

However, if no bump 10 is formed on the wiring 3, as shown in FIG. 1(b), then the output value of the height position counter 44 will be the value of the second detected position H2 stored in the memory 60, i.e., a value that is below the permissible error range of the first detected position H1. As a result, a "bump not-adhered" signal is outputted from the comparator circuit 61. When the control circuit 42 receives this "bump not-adhered" signal, the control circuit 42 outputs an abnormality signal for "bump not-adhered" situation and stops the wire bonding apparatus.

The stopping of the wire bonding apparatus in the "bump not-adhered" situation is executed in any of the following cases. In a first stopping scheme, the wire bonding apparatus is immediately stopped when it is judged that the lowered position of the capillary 5 is below the permissible error range of the first detected position H1. In other words, the wire bonding apparatus is stopped before the capillary 5 reaches the state shown in FIG. 1(b). In a second stopping scheme, the wire bonding apparatus is stopped after the wire 4 is connected to the wiring 3 and the wire 4 is cut. However, it goes without saying that the first stopping scheme method is desirable, since the wire 4 is not connected to the wiring 3 in this case.

In the above-described embodiment, the first conductor is a pad 2a, and the second conductor is wiring 3. However, it goes without saying that the present invention includes that the first conductor 1 is wiring 3, and the second conductor is a pad 2a.

The invention claimed is:

1. A wire bonding method comprising:
performing primary bonding on a first conductor of a device;
lowering a capillary to a capillary position on a second conductor to determine if a bump is formed at said second conductor; wherein
when said capillary position is with in a permissible error range, performing secondary bonding at said second conductor to connect a wire between said first conductor and second conductor, and when said capillary position is outside said permissible error range, a bonding apparatus that executes said method is stopped.

2. A wire bonding method comprising the steps of:
performing primary bonding of a formed ball on a tip end of a bonding wire of a capillary onto a first conductor of a device during primary bonding;
looping said bonding wire from said first conductor to a second conductor;
lowering said capillary to a capillary position at said second conductor to determine if a bump is formed at said second conductor;
performing secondary bonding of said bonding wire when said capillary position is within a permissible error range at said second conductor; and
judging said bump being not bonded onto said second conductor as a "bump not-adhered" situation when said capillary position is outside said permissible error range of said capillary position at said second conductor.

3. The method according to claim 2, further comprising stopping immediately a wire bonding apparatus upon the basis of the judging step.

4. The method according to claim 2, further comprising stopping a wire bonding apparatus before performing secondary bonding onto said bump on said second conductor upon the basis of the judging step.

5. A wire bonding method using a wire bonding apparatus, comprising
providing a wire bonding apparatus, said wire bonding apparatus comprising:
a bonding arm swingably supported with a supporting frame, said bonding arm having a capillary on one end thereof;
a linear motor for driving said bonding arm to swing,
a position sensor for detecting a position of said bonding arm in a vertical direction, and
a computer for controlling a height position of said capillary, said computer including:
a height position counter for generating a height position signal indicating said height position of said capillary in said vertical direction by processing a signal from said position sensor,
a memory for storing said height position of said capillary of a permissible error range if a bump is formed on a second conductor of a device in a normal maimer, and
a comparator circuit for outputting a "bump not-adhered" signal when an output value of said height position counter is outside said permissible error range of said detected position stored in said memory;
performing a preliminary bonding of a formed bail on a tip end of a wire of said capillary onto said second conductor of said device so as to form a bump on said second conductor;
forming said bump by cutting said wire from a bonded bail on said second conductor, said bonded ball being bonded by said performing preliminary bonding by means of said wire bonding apparatus;
performing primary bonding of a formed ball on the tip end of said bonding wire of said capillary onto a first conductor of said device during primary bonding;
looping said wire from said first conductor to said second conductor to perform secondary bonding at said second conductor to connect said wire between said first and second conductor when said height position is within said permissible error range with said wire bonding apparatus;

lowering said capillary at said second conductor to a height position to determine if a bump is adhered to said second conductor; and judging said bump being not bonded onto said second conductor as said "bump not-adhered" situation when said capillary height position is outside said permissible error range of said capillary position stored in said memory of said wire bonding apparatus.

6. The method according to claim 5, further comprising stopping immediately said wire bonding apparatus upon the basis of said judging step.

* * * * *